US007691692B2

(12) United States Patent
Yamazaki et al.

(10) Patent No.: US 7,691,692 B2
(45) Date of Patent: *Apr. 6, 2010

(54) SUBSTRATE PROCESSING APPARATUS AND A MANUFACTURING METHOD OF A THIN FILM SEMICONDUCTOR DEVICE

(75) Inventors: Shunpei Yamazaki, Setagaya (JP); Hisashi Ohtani, Atsugi (JP); Hiroyuki Shimada, Atsugi (JP); Mitsunori Sakama, Atsugi (JP); Hisashi Abe, Atsugi (JP); Satoshi Teramoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/232,433

(22) Filed: Sep. 17, 2008

(65) Prior Publication Data

US 2009/0029509 A1      Jan. 29, 2009

Related U.S. Application Data

(60) Continuation of application No. 11/727,257, filed on Mar. 26, 2007, now Pat. No. 7,452,794, which is a division of application No. 10/164,019, filed on Jun. 7, 2002, now Pat. No. 7,271,082, which is a division of application No. 08/685,788, filed on Jul. 24, 1996, now Pat. No. 6,482,752, which is a continuation of application No. 08/321,321, filed on Oct. 11, 1994, now abandoned.

(30) Foreign Application Priority Data

Oct. 26, 1993 (JP) ................................. 5-291268
Dec. 24, 1993 (JP) ................................. 5-347645
Dec. 24, 1993 (JP) ................................. 5-347646

(51) Int. Cl.
    *H01L 21/00* (2006.01)
(52) U.S. Cl. .................. 438/166; 438/149; 438/164; 257/E29.117
(58) Field of Classification Search ................ 438/166, 438/584–586, 149, 152, 479, 162, 164; 257/E29.117
See application file for complete search history.

(56) References Cited

U.S. PATENT DOCUMENTS 4,051,273 A     9/1977  Abbas et al.

(Continued)

FOREIGN PATENT DOCUMENTS

CN        1085352        4/1994

(Continued)

OTHER PUBLICATIONS

Wolf et al:, "Silicon Processing For the VLSI Era", vol. 1, 1986, pp. 175-178, 182-183, 185-188 and 191-194.

(Continued)

*Primary Examiner*—Thanh Nguyen
(74) *Attorney, Agent, or Firm*—Eric J. Robinson; Robinson Intellectual Property Law Office, P.C.

(57) ABSTRACT

A substrate processing apparatus includes a plurality of evacuable treatment chambers connected to one another via an evacuable common chamber, and the common chamber is provided with means for transporting a substrate between each treatment chamber. More specifically, a substrate processing apparatus includes a plurality of evacuable treatment chambers, at least one of said treatment chambers having a film formation function through a vapor phase reaction therein, at least one of said treatment chambers having an annealing function with light irradiation and at least one of said treatment chambers having a heating function therein. The apparatus also has a common chamber through which said plurality of evacuable treatment chambers are connected to one another, and a transportation means provided in said common chamber for transporting a substrate between each treatment chamber.

36 Claims, 4 Drawing Sheets

U.S. PATENT DOCUMENTS

| | | | |
|---|---|---|---|
| 4,266,985 A | 5/1981 | Ito et al. | |
| 4,592,306 A | 6/1986 | Gallego | |
| 4,636,401 A | 1/1987 | Yamazaki et al. | |
| 4,748,131 A | 5/1988 | Zietlow | |
| 4,892,753 A | 1/1990 | Wang et al. | |
| 4,894,352 A | 1/1990 | Lane et al. | |
| 4,917,556 A | 4/1990 | Stark et al. | |
| 4,923,584 A | 5/1990 | Bramhall, Jr. et al. | |
| 4,951,601 A | 8/1990 | Maydan et al. | |
| 4,962,063 A | 10/1990 | Maydan et al. | |
| 5,067,218 A | 11/1991 | Williams | |
| 5,076,205 A | 12/1991 | Vowles et al. | |
| 5,135,608 A | 8/1992 | Okutani et al. | |
| 5,186,718 A | 2/1993 | Tepman et al. | |
| 5,237,188 A | 8/1993 | Iwai et al. | |
| 5,258,333 A | 11/1993 | Shappir et al. | |
| 5,259,881 A | 11/1993 | Edwards et al. | |
| 5,271,972 A | 12/1993 | Kwok et al. | |
| 5,278,093 A | 1/1994 | Yonehara | |
| 5,292,393 A | 3/1994 | Maydan et al. | |
| 5,313,075 A | 5/1994 | Zhang et al. | |
| 5,324,360 A | 6/1994 | Kozuka | |
| 5,330,633 A | 7/1994 | Matsumoto et al. | |
| 5,338,362 A | 8/1994 | Imahashi | |
| 5,352,291 A | 10/1994 | Zhang et al. | |
| 5,370,739 A | 12/1994 | Foster et al. | |
| 5,403,772 A | 4/1995 | Zhang et al. | |
| 5,424,244 A | 6/1995 | Zhang et al. | |
| 5,445,491 A | 8/1995 | Nakagawa et al. | |
| 5,512,320 A | 4/1996 | Turner et al. | |
| 5,521,107 A | 5/1996 | Yamazaki et al. | |
| 5,523,240 A | 6/1996 | Zhang et al. | |
| 5,545,571 A | 8/1996 | Yamazaki et al. | |
| 5,583,369 A | 12/1996 | Yamazaki et al. | |
| 5,650,013 A | 7/1997 | Yamazaki | |
| 5,665,210 A | 9/1997 | Yamazaki | |
| 5,766,360 A | 6/1998 | Sato et al. | |
| 5,807,772 A | 9/1998 | Takemura | |
| 5,821,559 A | 10/1998 | Yamazaki et al. | |
| 5,849,043 A | 12/1998 | Zhang et al. | |
| 5,854,494 A | 12/1998 | Yamazaki et al. | |
| 5,897,710 A | 4/1999 | Sato et al. | |
| 5,899,709 A | 5/1999 | Yamazaki et al. | |
| 5,904,567 A | 5/1999 | Yamazaki | |
| 5,917,221 A | 6/1999 | Takemura | |
| 5,946,561 A | 8/1999 | Yamazaki et al. | |
| 6,004,831 A | 12/1999 | Yamazaki et al. | |
| 6,013,928 A | 1/2000 | Yamazaki et al. | |
| 6,028,333 A | 2/2000 | Yamazaki et al. | |
| 6,144,057 A | 11/2000 | Yamazaki | |
| 6,177,302 B1 | 1/2001 | Yamazaki et al. | |
| 6,261,877 B1 | 7/2001 | Yamazaki et al. | |
| 6,326,642 B1 | 12/2001 | Yamazaki et al. | |
| 6,340,830 B1 | 1/2002 | Takemura | |
| 6,358,784 B1 | 3/2002 | Zhang et al. | |
| 6,482,752 B1 * | 11/2002 | Yamazaki et al. | 438/758 |
| 6,528,852 B2 | 3/2003 | Takemura | |
| 6,566,711 B1 | 5/2003 | Yamazaki et al. | |
| 6,607,947 B1 | 8/2003 | Zhang et al. | |
| 6,655,767 B2 | 12/2003 | Zhang et al. | |
| 6,784,033 B1 | 8/2004 | Yamazaki | |
| 6,786,997 B1 | 9/2004 | Yamazaki | |
| 6,815,772 B2 | 11/2004 | Takemura | |
| 6,953,713 B2 | 10/2005 | Yamazaki et al. | |
| 6,977,392 B2 | 12/2005 | Yamazaki et al. | |
| 6,979,840 B1 | 12/2005 | Yamazaki et al. | |
| 6,984,595 B1 | 1/2006 | Yamazaki | |
| 7,169,657 B2 | 1/2007 | Zhang et al. | |
| 7,271,082 B2 * | 9/2007 | Yamazaki et al. | 438/584 |
| 7,355,202 B2 | 4/2008 | Zhang et al. | |
| 7,452,794 B2 * | 11/2008 | Yamazaki et al. | 438/584 |
| 2006/0060852 A1 | 3/2006 | Yamazaki et al. | |

FOREIGN PATENT DOCUMENTS

| | | |
|---|---|---|
| EP | 0 459 763 | 12/1991 |
| EP | 0 468 758 | 1/1992 |
| EP | 0 485 233 A2 | 5/1992 |
| EP | 0 532 314 | 3/1993 |
| JP | 60-043869 | 3/1985 |
| JP | 60-245174 | 12/1985 |
| JP | 02-159069 | 6/1990 |
| JP | 02-266519 | 10/1990 |
| JP | 03-044058 | 2/1991 |
| JP | 03-022057 | 3/1991 |
| JP | 03-070367 | 7/1991 |
| JP | 03-070367 | 11/1991 |
| JP | 04-080928 | 3/1992 |
| JP | 04-137522 | 5/1992 |
| JP | 04-137613 | 5/1992 |
| JP | 04-165679 | 6/1992 |
| JP | 05-036606 | 2/1993 |
| JP | 05-055148 | 3/1993 |
| JP | 05-074716 | 3/1993 |
| JP | 05-129609 | 5/1993 |
| JP | 05-152331 | 6/1993 |
| JP | 05-152333 | 6/1993 |
| JP | 05-232515 | 9/1993 |
| JP | 05-259083 | 10/1993 |
| JP | 05-259259 | 10/1993 |
| JP | 05-267667 | 10/1993 |
| JP | 05-275344 | 10/1993 |
| JP | 05-275519 | 10/1993 |
| JP | 05-291575 | 11/1993 |
| JP | 05-315359 | 11/1993 |
| JP | 05-326430 | 12/1993 |
| JP | 05-335572 | 12/1993 |
| JP | 05-343689 | 12/1993 |
| JP | 08-167597 | 6/1996 |

OTHER PUBLICATIONS

Wolf et al., "Silicon Processing For the VLSI Era", vol. 2, 1990, pp. 188-189, 194-195, 220-222 and 235-239.

Nikkei Microdevices Oct. 1993, entitled "Outlook of a Single Substrate Plasma Enchanced CVD Apparatus for Manufacturing Thin Film Transistors (TFTs) Liquid Crystal Has Been Made Clear" by Nikkei, pp. 81-85, English Translation.

Fine Process Technology Japan 1993, pp. 1-11 entitled "A New Multi-Chamber Single Substrate Plasma Enhanced CVD System" by James M. Moriarty, English Translation.

Wolf, Stanley, "Silicon Processing for the VLSI ERA," vol. 1, Lattice Press, 1986, pp. 177-178.

Wolf, Stanley, "Silicon Processing for the VLSI ERA," vol. 2, Lattice Press, 1990, pp. 188-199, 194-196 and 238-239.

Fine Process Technology Japan 1993, pp. 1-11 entitled "A New Multi-Chamber Single Substrate Plasma Enchanced CVD System" by James M. Moriarty, English Translation.

S. Wolf and R.N. Tauber, "Silicon Processing for the VLSI ERA," vol. 1—Process Technology, pp. 57-58.

Harriott, "In Situ Processing of Semiconductors," Journal of Materials Science and Engineering, B14 (1992) pp. 336-345.

Park, B., Nikkei Microdevices Oct. 1993, entitled "Outlook of a Single Substrate Plasma Enchanced CVD Apparatus for Manufacturing Thin Film Transistors (TFTs) Liquid Crystal Has Been Made Clear" by Nikkei, pp. 81-85, English Translation.

S. Wolf and R.N. Tauber, "Silicon Processing for the VLSI ERA," vol. 1—Process Technology, pp. 57-58, 1986.

* cited by examiner

| Chamber | 103 | 104 | 105 | 106 |
|---|---|---|---|---|
| Process | PCVD RTP | preheat | PCVD LPCVD | PCVD |
| Power | 13.56MHz 500 W | — | 13.56MHz 500 W | 13.56MHz 500 W |
| Electrode | parallel plate | parallel plate | parallel plate | parallel plate |
| Process Gas | $N_2$, $SiH_4$, $NH_3$, $Al(CH_3)_3$ | $N_2O$, $N_2$, $NH_3$, $O_2$ | $N_2$, TEOS, $O_2$, $C_2F_6$ | $N_2$, $SiH_4$, $H_2$, $Si_2H_6$, $Si_3H_8$ |
| Cleaning Gas | $NF_3 + N_2$ | — | $NF_3 + N_2$ | $NF_3 + N_2$ |
| Substrate Temp. | 450 °C | 450 °C | 600 °C | 550 °C |
| Film | $Si_3N_4$ AlN | — | $SiO_2$ $SiO_2F_x$ | Si |
| Vacuum degree (Torr) | $5 \times 10^{-2}$ | $5 \times 10^{-2}$ | $5 \times 10^{-2}$ | $5 \times 10^{-5}$ |

SUBSTRATE PROCESSING APPARATUS AND A MANUFACTURING METHOD OF A THIN FILM SEMICONDUCTOR DEVICE

BACKGROUND OF THE INVENTION

1. Field of the Invention

The present invention relates to an apparatus for forming a semiconductor device on or within a surface of a substrate. In particular, the present invention relates to an apparatus which is capable of processing a substrate sequentially without exposing to the outside air. Also, the present invention relates to a multi-purpose substrate processing apparatus which can be used to manufacture a thin film integrated circuit.

2. Prior Art

Integrated circuits which use semiconductor substrates or glass substrates are known. The former is known as IC or LSI and the latter is known, for example, as a liquid crystal device of an active matrix type. It is necessary to carry out each process successively in order to manufacture the integrated circuits. For example, when manufacturing an insulated gate field effect semiconductor device, it is desired that a channel forming semiconductor region and a gate insulating layer contacting thereto be formed sequentially without exposing to the air.

Also, there was a manufacturing system for producing a semiconductor device which utilizes an amorphous silicon or a single crystalline silicon, however, there was no manufacturing system which is suitable for manufacturing a semiconductor device which utilizes a polycrystalline silicon.

BRIEF SUMMARY OF THE INVENTION

It is an object of the present invention to provide a substrate processing apparatus which can be used multi-purposely, more specifically, which is capable of performing each step of manufacturing a semiconductor device successively in one apparatus.

It is another object of the present invention to provide a method and a manufacturing apparatus for manufacturing a polycrystalline semiconductor device successively, for example, for forming a silicon film and performing a crystallization thereof in different chambers successively.

In accordance with a first accept of the present invention, a substrate processing apparatus includes a plurality of evacuable treatment chambers (i.e. chambers capable of being evacuated) connected to one another via an evacuable common chamber, and the common chamber is provided with means for transporting a substrate between each treatment chamber.

More specifically, a substrate processing apparatus includes a plurality of evacuable treatment chambers, at least one of said treatment chambers having a film formation function through a vapor phase reaction therein, at least one of said treatment chambers having an annealing function with light irradiation and at least one of said treatment chambers having a heating function therein. The apparatus also has a common chamber through which said plurality of evacuable treatment chambers are connected to one another, and a transportation means provided in said common chamber for transporting a substrate between each treatment chamber.

Also, a method for operating the substrate processing apparatus in accordance with the first aspect of the present invention is characterized by the steps of transferring a substrate between a treatment chamber and a common chamber while the pressure in both chambers is maintained equal with each other.

In accordance with a second aspect of the present invention, a method for manufacturing a semiconductor device which utilizes a polycrystalline silicon comprises the steps of forming a non-single crystalline silicon film in a first chamber through LPCVD using polysilane such as disilane and performing another step, for example, a formation of an insulating film adjacent to the silicon film or a crystallization thereof, in a second chamber successively without exposing a substrate to the outside air. The inventors found that when a silicon film is formed through a glow discharge plasma CVD, the quality of the silicon film tends to be hindered because hydrogen effuses from the silicon film when it is crystallized. Accordingly, even if a multi-chamber system was used, the quality of the polycrystalline silicon semiconductor device could not be so improved. Based on the recognition of this problem, the silicon film is formed through LPCVD using a polysilane. Moreover, quality of an interface between the silicon film and its adjacent insulating film can be improved by forming the silicon film and the insulating film adjacent thereto successively without exposing them to the air.

BRIEF DESCRIPTION OF THE DRAWINGS

The foregoing and other features of the invention will be described in preferred embodiments of the invention with reference to the attached drawings in which.

DESCRIPTION OF PREFERRED EMBODIMENTS OF THE PRESENT INVENTION

Figure 1:
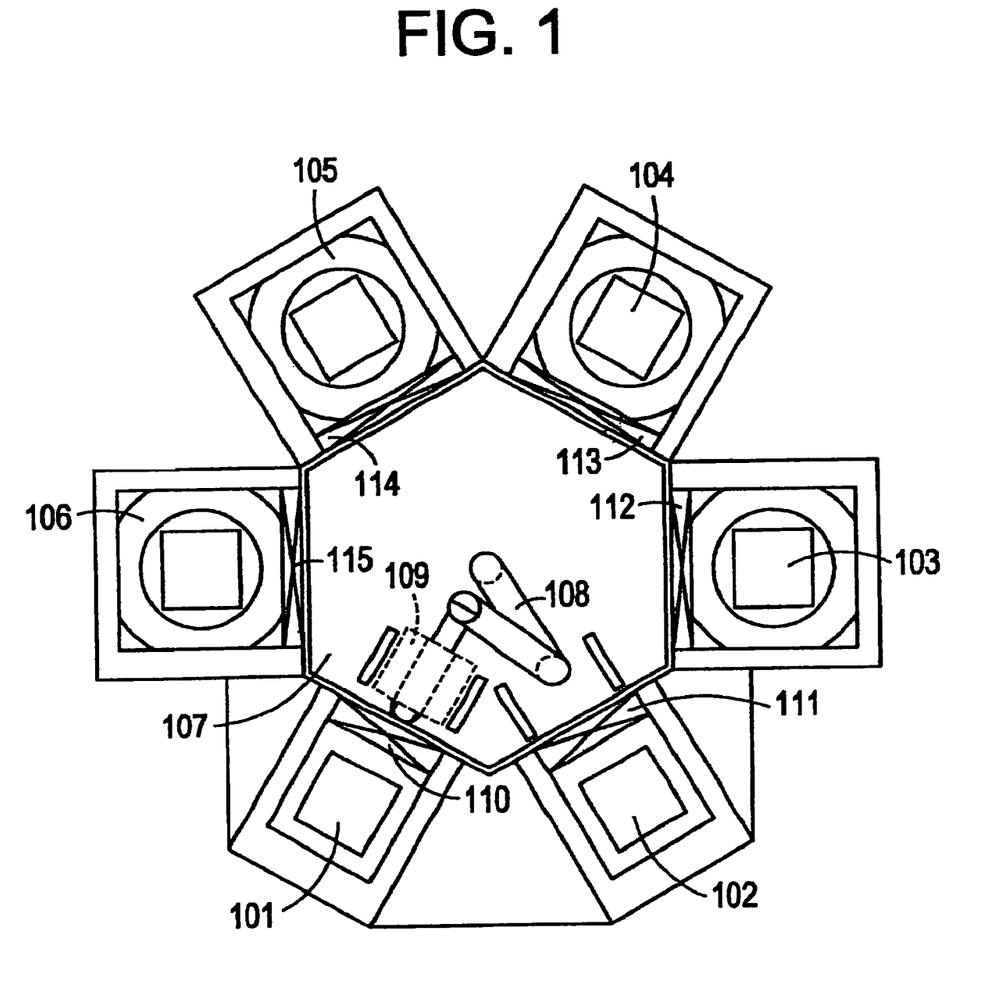
FIG. 1 shows a schematic diagram of a substrate processing apparatus of the present invention.

A first preferred embodiment in accordance with the first aspect of the invention will be described with reference to FIG. 1. FIG. 1, the reference numeral 107 shows a common chamber which in turn is a substrate transfer chamber. Among treatment chambers 101-106, the chambers 101 and 102 are auxiliary chambers through which a substrate is loaded and unloaded. The chamber 103 is, for example, a sputtering apparatus for forming an insulating film. The chamber 104 is, for example, a plasma CVD apparatus for forming an amorphous silicon. The chamber 105 is, for example, a heating furnace for forming a thermal oxide film. The chamber 106 is, for example, an annealing furnace for performing an annealing with light irradiation. The kinds of treatments carried out in each treatment chamber can be determined arbitrarily. Examples of treatments are plasma CVD, LPCVD (low pressure thermal CVD), photo CVD, microwave CVD, heating furnace, annealing furnace with light irradiation, sputtering, plasma annealing, isotropic or anisotropic etching, etc. More specific examples of the first preferred embodiment will be described below.

EXAMPLE 1

Figure 4:
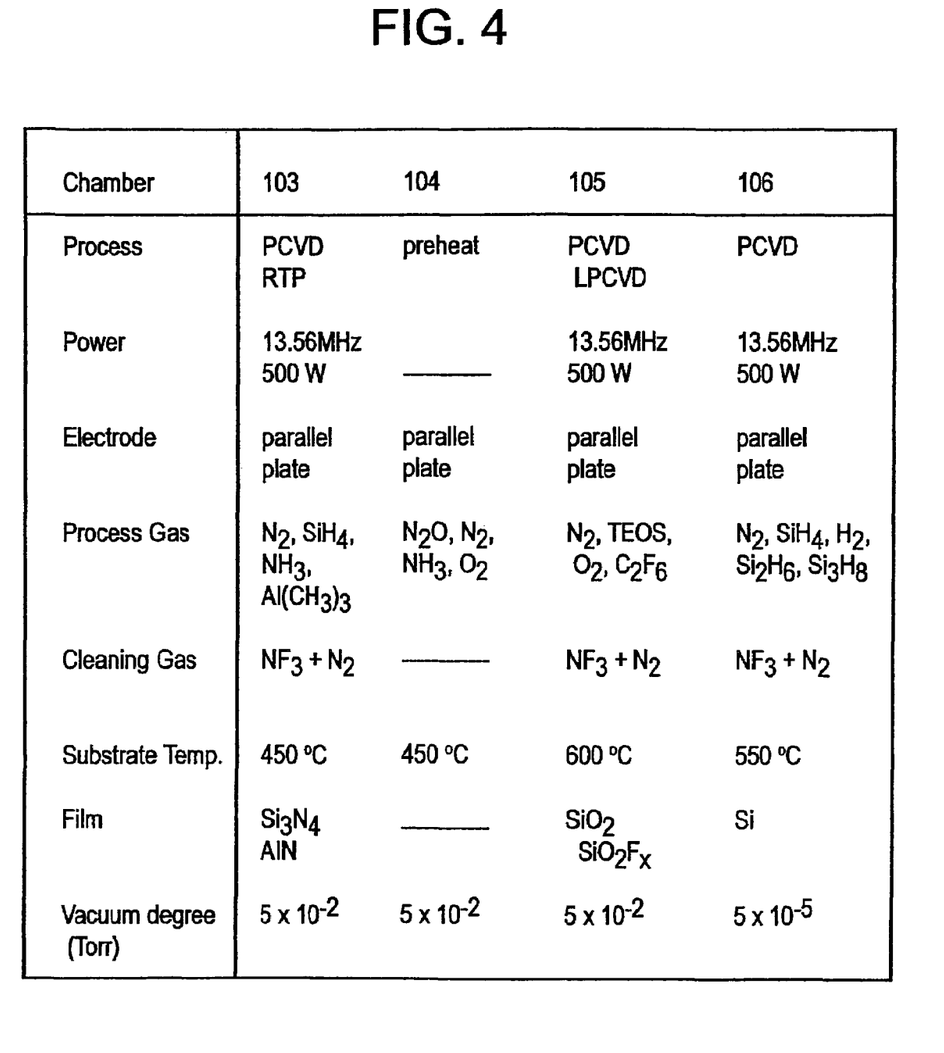
FIG. 4 shows an example of a specification of each chamber of the apparatus shown in FIG. 1.

Referring to FIG. 1, the chambers 101 and 102 are used to load and unload substrates. These chambers have a function of holding a cassette to which a plurality of substrates are placed. Obviously, these chambers are provided with means for introducing therein necessary gases such as an inert gas or a cleaning gas and an evacuation means. (not shown) For example, the substrate is 4×4 inches square, 5×5 inches square or 5×6 inches. The chambers 103, 105 and 106 are used to form films, respectively. The chamber 104 is a temperature controlling chamber which has a function of preheating a substrate to a predetermined temperature before a plasma CVD in another chamber. FIG. 4 shows a specification of each treatment chamber. The chamber 107 is a substrate transfer chamber in which a robot arm 108 is provided for moving a substrate between each treatment chamber. The robot arm has a function of taking out a substrate 109 from the auxiliary chamber 101 or 102 and transferring it to a desired treatment chamber. The substrate transfer chamber is provided with an evacuating means to evacuate it to a desired vacuum. (not shown)

The transfer of a substrate between each chamber is carried in the following manner. Provided that a substrate initially held in the auxiliary chamber is moved into the treatment chambers 103 and 104 and treated therein sequentially, following which it is transferred into the auxiliary chamber 102, the substrate conveying process comprises the following sequential steps of:

(1) while evacuating the auxiliary chamber 101 and the transfer chamber 107 to a same degree of vacuum, opening a gate valve 110 and transferring the substrate 109 to the transfer chamber 107 using the robot arm 108, after that the gate valve 110 is closed;

(2) while evacuating the transfer chamber 107 and the treatment chamber 103 to a same degree of vacuum, opening a gate valve 112 and transferring the substrate 109 into the treatment chamber 103 following which the gate valve 112 is closed;

(3) performing a predetermined treatment on the substrate in the treatment chamber 103;

(4) after evacuating the treatment chamber 103 to a same degree as in the transfer chamber 107, opening the gate valve 112 and transferring the substrate 109 into the transfer chamber 107 with a robot arm following which the gate valve 112 is closed;

(5) while evacuating the transfer chamber 107 and the treatment chamber 104 to a same degree of vacuum, opening a gate valve 113 and transferring the substrate 109 into the treatment chamber 104 following which the gate valve 113 is closed;

(6) performing a predetermined treatment on the substrate in the treatment chamber 104;

(7) after evacuating the treatment chamber 104 to a same degree as in the transfer chamber 107, opening the gate valve 113 and transferring the substrate with a robot arm following which the gate valve 113 is closed; and then, (8) while maintaining the transfer chamber 107 and the auxiliary chamber 102 at a same degree of a vacuum, opening a gate valve 111 and transferring the substrate to the auxiliary chamber 102 with the robot arm 108, and then closing the gate valve 111.

In the above manner, it is possible to perform two or more treatments successively without exposing the substrate to an outside air.

Substrates held in the cassette in the auxiliary chambers 101 can be processed one by one successively by repeating the foregoing steps (1) to (8). A substrate on which the predetermined process has be finished is automatically put into a cassette placed in the auxiliary chamber 102. Also, it is possible to clean the treatment chamber 104 while performing a film formation in the chamber 103 or to clean the treatment chamber 103 while performing a film formation in the chamber 104. Accordingly, it is possible to perform the predetermined process in one chamber and to clean another treatment chamber(s) at the same time without stopping the operation of the entire apparatus. $NF_3$ can be used as a cleaning gas for plasma cleaning the inside of the chambers.

EXAMPLE 2

This example is directed to a manufacture of a thin film integrated circuit including at least one thin film transistor. FIGS. 2A-2F show a manufacturing process of the thin film transistor.

Figure 2A:
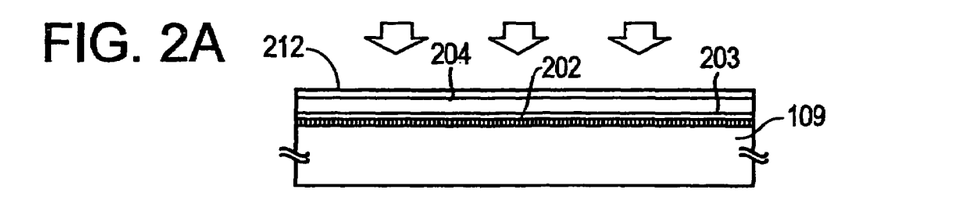
FIGS. 2A-2F show a manufacturing process of a semiconductor device in accordance with Example 2 of the invention.

Referring again to FIG. 1, the treatment chamber 103 is designed to form an aluminum nitride (aluminum oxinitride) or silicon nitride film through a plasma CVD, the treatment chamber 104 is used to conduct a rapid thermal annealing or preheating with an infrared ray for a short duration, the treatment chamber 105 is designed to form a silicon oxide film through a plasma CVD using TEOS (tetraethoxysilane) and the treatment chamber 106 is designed to form an amorphous silicon film through a plasma CVD as shown in FIG. 2A. These chambers are each provided with a gas introducing means and an evacuation means. (not shown)

Initially, a Corning 7059 glass substrate 109 (4×4 inches square, 5×5 inches square or 5×6 inches) is placed in the auxiliary chamber 101. The chamber 101 is evacuated preferably to a same degree of vacuum as in the transfer chamber 107 which is maintained at a sufficiently high vacuum. Then, after opening the gate valve 110, the substrate 109 is transferred from the auxiliary chamber 101 to the transfer chamber 107 with the robot arm 108. Then, while maintaining the treatment chamber 103 at a same vacuum as in the transfer chamber 107, the gate valve 112 is opened and the substrate is transferred to the treatment chamber 103, following which the gate valve 112 is closed. In the treatment chamber 103, an aluminum nitride film 202 is formed on the substrate to a thickness of 2000-5000 Å through plasma CVD. $Al(C_4H_9)_3$ or $Al(CH_3)_3$ is used as a starting material gas together with a nitrogen gas. It is possible to add $N_2O$ at a small amount in order to reduce a thermal expansion stress.

After the formation of the aluminum nitride 202, the treatment chamber 103 is again evacuated to the same degree of vacuum as the transfer chamber 107, following which the gate valve 112 is opened and the substrate 109 is transferred from the treatment chamber 103 into the transfer chamber 107. In the later steps, the transfer of the substrate between each treatment chamber and the transfer chamber will be done in this manner. Also, needless to say, films formed on the substrate 109 are transferred together with the substrate when the substrate is transferred between the chambers although it is not specifically mentioned.

The substrate 109 is then transferred into the chamber 104 to perform a rapid thermal annealing. The annealing is done in an atmosphere of nitrogen, ammonium ($NH_3$) or dinitrogen monoxide ($N_2O$). The aluminum nitride film 202 is rapidly heated by the annealing and becomes transparent. At the same time, the insulating property and the thermal conductivity of the film can be improved. It is possible to form a silicon nitride film in order to prevent an impurity such as sodium from diffusing into a semiconductor film from the glass substrate. The silicon nitride film can be formed through plasma CVD at a substrate temperature 350° C., at a pressure of 0.1 Torr, using a mixture gas of $SiH_4$ and $NH_3$.

After the rapid thermal annealing, the substrate is transferred from the chamber 104 to the chamber 105 through the transfer chamber 107 in the same manner as explained above. In the chamber 105, a silicon oxide film 203 is formed to a thickness of 50-2000 Å through a plasma CVD using a TEOS gas mixed with oxygen as a starting material. The process parameters are shown below:

| | |
|---|---|
| TEOS/O₂ ratio | 10/100 sccm |
| RF power | 350 W |
| substrate temp. | 400° C. |
| pressure | 0.25 Torr |

It is possible to add a $C_2F_6$ gas to the starting gas in order to form a film expressed by a formula $SiOF_x$. The silicon oxide film 203 will be an underlying layer for a thin film transistor to be formed later. Also, it is possible to carry out a rapid thermal annealing in the treatment chamber 104 after the formation of the silicon oxide film 203.

Then, the substrate is transferred into the treatment chamber 106 where an amorphous silicon film 204 is formed to a thickness of 100-1500 Å, preferably, from 300 to 800 Å through a plasma CVD or LPCVD with the following formation parameters:

| | |
|---|---|
| SiH₄ | 200 sccm |
| RF power | 200 W |
| substrate temp. | 250° C. |
| pressure | 0.1 Torr |

The amorphous silicon film may be formed using $Si_2H_6$ and $Si_3H_8$ in a LPCVD (low pressure thermal CVD). An example of a formation condition in the case of using LPCVD is shown below.

| | |
|---|---|
| Si₂H₆ | 100-500 sccm |
| He | 500 sccm |
| formation temp. | 400-500° C. |
| pressure | 0.1-1 Torr |

Further, the substrate is transferred to the treatment chamber 105 where a silicon oxide film 212 is formed to a thickness of 500-1500 Å through a plasma CVD using TEOS as a starting material. This film functions as a blocking layer for the silicon film. The formation conditions of the silicon oxide film 212 is as follows:

| | |
|---|---|
| TEOS/O₂ | 10/1000 sccm |
| RF power | 300 W |
| substrate temp. | 350° C. |
| pressure | 0.25 Torr |

As a result, an aluminum nitride or silicon nitride blocking film 202, a silicon oxide film 203, a silicon semiconductor film 204 and a blocking film 212 can be laminated on a substrate 109 successively as shown in FIG. 2A. Since each treatment chamber is divided from the transfer chamber 107 by the gate valve, a mutual contamination with impurities between each chamber can be avoided. As a result, it is possible to reduce a concentration of C, N and O in the silicon film to at least $5 \times 10^{18}$ atoms/cm³ or less, respectively.

Figure 2B:
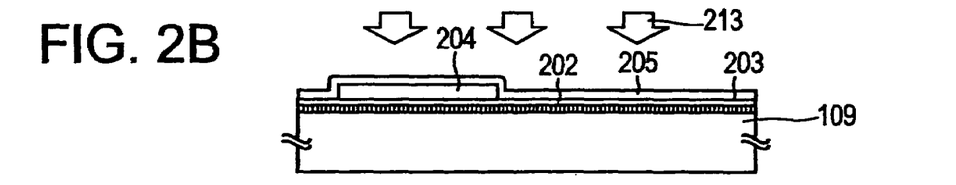

Next, the substrate having the above laminated structure thereon is taken out from the auxiliary chamber 102 in order to pattern the silicon semiconductor film into an island form as shown in FIG. 2B. Then, a silicon oxide film 205 is formed on the patterned silicon film 204 to a thickness of 200-150 Å, preferably 500-1000 Å to form a gate insulating film. The silicon oxide film 205 is formed using TEOS gas and oxygen gas at a volume ratio 1:1 to 1:3, at a pressure of 0.05-0.5 Torr, and at an RF power of 100-2 50 W. This step may be carried out in the treatment chamber 105. In this case, it is preferable to perform a rapid thermal annealing with IR light in $N_2O$ atmosphere in the annealing chamber 104 after the formation of the silicon oxide film 205. Alternatively, the silicon oxide film can be formed through a LPCVD or an atmospheric pressure CVD using TEOS and ozone gas at 350-600° C. substrate temperature, preferably, 400-550° C.

After the formation of the silicon oxide film 205, the silicon oxide film is annealed in oxygen or ozone atmosphere at 400-600° C. for 30-60 minutes.

The interface states in the silicon oxide film 205 and the silicon film 204 can be greatly reduced by the annealing step.

Then, as shown in FIG. 2B, a KrF excimer laser 213 (wavelength 248 nm or 308 nm, pulse width 20 nsec) is irradiated in order to crystallize the silicon film 204. The energy density of the laser is 200-400 mJ/cm², preferably, 250-300 mJ/cm². Also, the substrate is heated at 300-500° C. during the laser irradiation. When observing the silicon film 204 through a Raman scattering spectrometry, a relatively broad peak is observed not at the 521 cm⁻¹ of a single crystal silicon but at around 515 cm⁻¹, which means that the silicon film 204 is crystalline, for example polycrystalline. The crystallization step may be carried out by a heat annealing. Thereafter, the substrate is annealed at 350° C. for 2 hours in a hydrogen atmosphere.

Figure 2C:
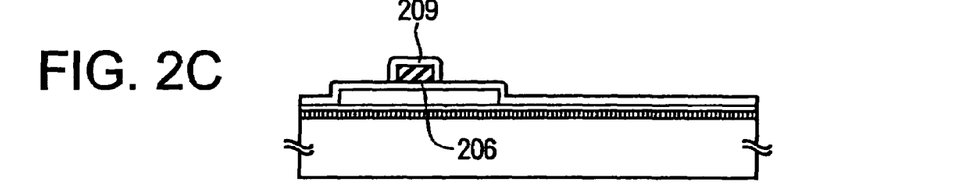

Next, an aluminum film is formed to a thickness of 2000 Å to 1 μm by an electron beam evaporation method, following which the aluminum film is patterned to be a gate electrode 206. It is possible to add scandium (Sc) to the aluminum at 0.15-0.2 weight %. Then, the aluminum gate electrode 206 is subjected to an anodic oxidation in an electrolyte. The electrolyte is ethylene glycol mixed with a tartaric acid at 1-3%. The pH of the electrolyte is set about 7. Also, the aluminum gate electrode functions as an anode while platinum is used as a cathode. At a first stage of the anodic oxidation, a voltage is increased to 220 V while maintaining a current constant, then this condition is maintained for 1 hour. The voltage is increased at a rate of 2-5 V/minute. Thus, an anodic oxide film 209 is formed to a thickness of 1500-3500 Å, for example, 2000 Å as shown in FIG. 2C.

When a high temperature treatment is necessary, it is desirable to use tantalum instead of aluminum.

After the formation of the anodic oxide film 209, an impurity (phosphorous) is added into a portion of the silicon film 204 by an ion doping method (also called as a plasma doping method) with the gate electrode portion used as a mask in a self-aligning manner. Phosphine ($PH_3$) is used as a dopant gas. The dose amount is $1-4 \times 10^{15}$ atoms/cm².

Figure 2D:
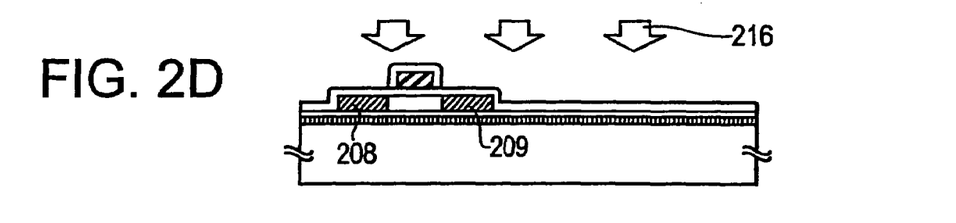

Further, a KrF excimer laser 216 (wavelength 248 nm or 308 nm, pulse width 20 nsec) is irradiated as shown in FIG. 2D in order to activate the introduced impurity and form impurity regions 208 and 209. At the same time, a damage caused by the introduction of the impurity is cured by the laser irradiation. The energy density of the laser beam is 150-400 mJ/cm², preferably, 200-250 mJ/cm². The sheet resistance of the impurity regions 208 and 209 is in the range of 200-800 Ω/square. In place of using a laser, a flush lump may be used in order to heat a sample to 1000-1 200° C. in a short time. This step is so called RTP (rapid thermal process). The temperature is observed by monitoring a temperature of a silicon.

Figure 2E:
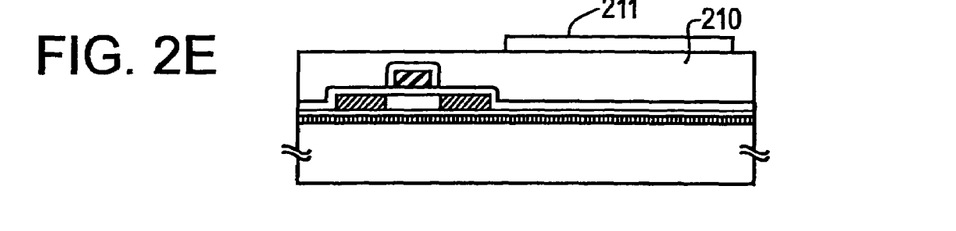

A silicon oxide film 210 is then formed on the entire surface as an interlayer insulator. The deposition is carried out in the treatment chamber 105 using a mixture of TEOS and oxygen as a starting gas. The CVD may be any one of plasma CVD, low pressure CVD or atmospheric pressure CVD. The thickness of the silicon oxide film is 0.3 µm to 1 µm, for example, 0.3 µm (3000 Å). The substrate temperature during the deposition is in the range of 250-450° C., for example, 350° C. The silicon oxide film is mechanically polished to obtain a leveled surface. This step may be replaced by an isotropic dry etching in a chamber provided in an apparatus of FIG. 1. Further, an ITO film is formed by sputtering and patterned to form a pixel electrode 211 as shown in FIG. 2E.

Figure 2F:
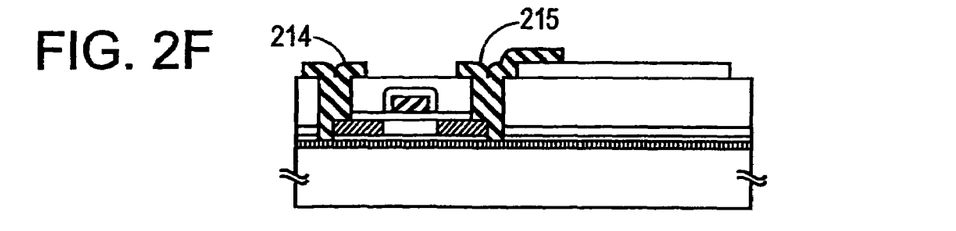

The interlayer insulator 210 is etched as shown in FIG. 2F in order to form contact holes through which wirings 214 and 215 can reach the impurity regions (source and drain regions). The wiring 215 is connected to the pixel electrode 211. Also, the material of the wirings is chromium or titanium nitride, for example. As shown in FIG. 2F, the wirings contact both of the top surface and side surface of the impurity regions. This configuration is called as a "top-side contact". The portion of the contact hole which extends beyond the silicon island occupies 30-70% of the entire area of the contact hole.

The use of the aluminum nitride or silicon nitride film 202 is particularly advantageous for obtaining the top-side contact because it prevents the substrate surface from being etched or damaged during forming the contact holes. Namely, even if the underlying silicon oxide film 203 is unintentionally etched off during the formation of the contact holes, the aluminum nitride or silicon nitride film 202 functions as an etching stopper.

Also, the top-side contact is advantageous because the size of the contact holes may be made relatively larger. In the prior art, the size of the contact hole should be smaller than the size of the source/drain region. However, in the top-side contact structure, the contact hole may be larger than the silicon island. Accordingly, the formation of the contact holes can be eased.

Finally, the entire structure is annealed in hydrogen at 300-400° C. for 1 to 2 hours in order to hydrogenate the silicon. Although not shown in the drawings, a plurality of TFTs are formed on the same substrate in the form of a matrix at the same time. Also, a peripheral circuit constituted by TFTs may be formed on the same substrate at through the same process. Thus, a circuit substrate for a monolithic type active matrix liquid crystal device is formed.

The substrate processing apparatus of the present invention is controlled by a microcomputer in order to obtain a higher production yield and a cost performance.

EXAMPLE 3

The third example of the present invention in accordance with a second aspect of the present invention will be described. The same apparatus shown in FIG. 1 is used in this example. However, the chamber 106 is used to perform LPCVD to form an amorphous silicon and the chamber 102 is used to perform LPCVD to form a p-doped polysilicon therein in this example.

Figure 3A:
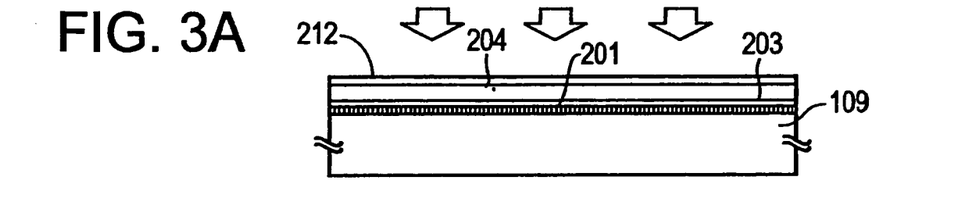
FIGS. 3A-3F show a manufacturing process of a semiconductor device in accordance with Example 3 of the invention.

Initially, a crystal glass substrate 109 which has a high heat resistivity, for example, N-0 glass manufactured by Nippon Electric Glass Co. is introduced into the substrate processing apparatus from the load-unload chamber 101. The transfer of the substrate is done in the same way as in the first example of the invention. The substrate 109 is transferred to the transfer chamber 107 and then introduced into the plasma CVD chamber 103 by the robot arm 108. In the chamber 103, a silicon nitride film 202 is formed through plasma CVD as shown in FIG. 3A. A mixture gas of $SiH_4$ and $NH_3$ is used as a starting gas. Also, the substrate temperature is 350° C. and the pressure inside the chamber is 0.1 torr. The silicon nitride film 202 will prevent a diffusion of alkali metals such as lithium contained in the glass substrate. In place of silicon nitride, it is possible to form silicon oxide added with a halogen element such as fluorine in order to block movable ions.

Then, the substrate is transferred into the chamber 105 via the transfer chamber 107 to form a silicon oxide film 203. The silicon oxide film 203 is formed to a thickness of 50-2000 Å by plasma CVD using TEOS and oxygen as a starting material with the following process condition:

| $TEOS/O_2$ | 10/100 sccm |
|---|---|
| RF power | 350 W |
| substrate temp. | 400° C. |
| pressure | 0.25 Torr |

Also, $C_2F_6$ may be added to the above starting material to form a film expressed by a chemical formula $SiOF_x$. The silicon oxide film 203 functions as a base film for a TFT to be formed thereon.

Then, the substrate is transferred to the chamber 106 in order to form an amorphous silicon film 204 through LPCVD with the following process condition:

| $Si_2H_6$ | 100 sccm |
|---|---|
| He | 200 sccm |
| Heating Temp. | 400° C.-570° C., preferably, 500-570° C. |
| Pressure | 0.3 Torr |
| growth rate | 50-500 Å/minute |

The use of a polysilane such as disilane is advantageous for obtaining a polycrystalline silicon film with an excellent property having an average grain size in the range of 250-8000 Å after a heat crystallization.

On the amorphous silicon film 204, a blocking film 212 comprising silicon oxide is formed in the chamber 105 by a plasma CVD using TEOS and oxygen as a starting material. Subsequently, the substrate is returned to the load-unload chamber 101 and taken out to the outside in order to pattern the amorphous silicon 204 together with the blocking film 212 into an island form and crystallize it. Since the patterning step and the crystallization step are not performed in a reduced pressure and take much longer time as compared with other steps, it is preferable that these steps are carried out with a different system in order to increase the operation rate of the apparatus. Accordingly, the blocking film 212 prevents the surface of the amorphous silicon film 204 form being contaminated by the air.

The patterning of the amorphous silicon film 204 is carried out by a known photolithography into a predetermined island pattern.

The heat crystallization is done at 550-600° C. in a nitrogen atmosphere for 8-56 hours. At this relatively low temperature, it is possible to obtain polycrystalline film with a large grain size as said above.

Then, a thermal annealing is performed at a higher temperature. The temperature is as high as the N-0 glass substrate can endure it, for example, 800-850° C. Thereby, the crystallinity within each crystal grain can be further improved. Also, this step may be carried out in an oxidizing atmosphere, for example, dry oxygen in order to form a thermal oxidation film. When using the thermal oxidation film as a gate insulating film, the appropriate thickness of the film is 500-2000 Å.

After the heat crystallization, the substrate is introduced again into the apparatus of the present invention from the auxiliary chamber 101. Depending upon necessity, the substrate is further transferred to the chamber 105, in which a silicon oxide film 205 is to be formed through a RF plasma CVD. Of course, the blocking film is removed by etching before the formation of the silicon oxide film 205 in an appropriate one of the chambers of the apparatus in order to expose a clean surface of the silicon film 204. The plasma CVD is carried out using TEOS and oxygen as a starting material and the substrate temperature at 300-450° C. The pressure ratio of the TEOS and oxygen is 1:1-1:3, and the entire pressure is 0.05-0.5 Torr. Also, the RF power is 100-250 W. Instead of plasma CVD, it is possible to form the silicon oxide film through LPCVD or atmospheric pressure CVD using TEOS mixed with ozone gas at a substrate temperature 350-600° C., preferably, 400-550° C.

Figure 3B:
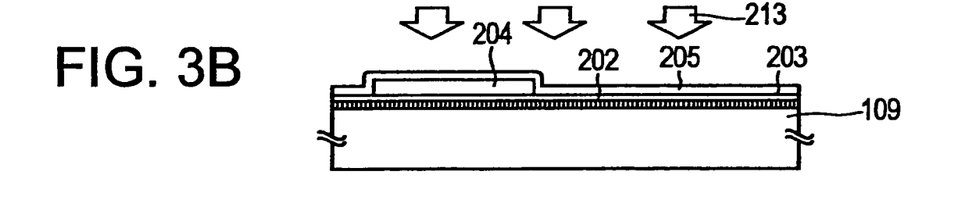

Thus, as shown in FIG. 3B, a blocking film 202 made of silicon nitride, silicon oxide film 203, a crystalline silicon film 204 patterned into an island form, and silicon oxide film 205. It is possible to maintain the concentration of carbon, nitrogen or oxygen at $5 \times 10^{18}$ atoms/cm$^3$ or less because of the use of the apparatus of the present invention.

It is advantageous to perform a rapid thermal annealing with an IR light in $N_2O$ atmosphere in the chamber 104 after the formation of the silicon oxide film 205 in order to reduce interface states between the silicon oxide film 205 and the silicon film 204.

Figure 3C:
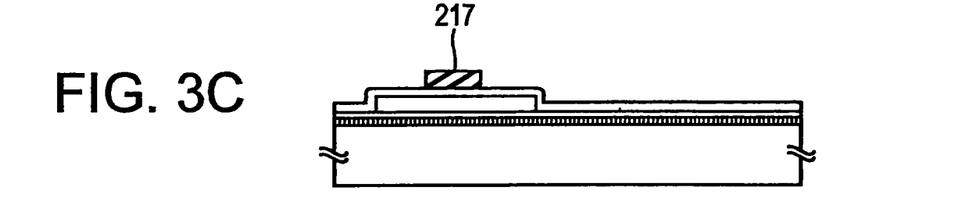
Figure 3D:
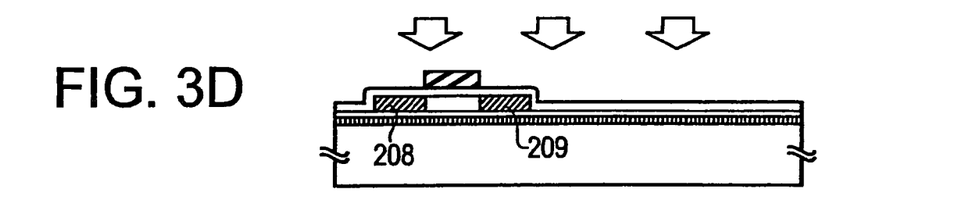

Then, transferring the substrate into the chamber 102, a phosphorous doped polysilicon film is formed through LPCVD to a thickness of 1000-4000 Å to form a gate electrode 217 as shown in FIG. 3C.

The steps starting from the formation of the underlying film and to the formation of the material for the gate electrode are carried out substantially without exposing the surface of each layer to the air. Thereby, it is possible to improve the each interface quality which is a main factor for determining the device property.

After the formation of the phosphorous doped polysilicon film, the substrate is taken out from the load-unload chamber 101. The next steps will be carried out outside of the apparatus of FIG. 1.

The phosphorous doped polysilicon film is patterned into a gate electrode 217 by drying etching. (FIG. 3C)

Then, the silicon island 204 is selectively doped with a dopant impurity (phosphorous) in a self-aligning manner using the gate electrode 217 in order to form source and drain regions 208 and 209. The doping is carried out by ion doping. Phosphine ($PH_3$) is used as a dopant gas. Also, the dose amount is $1-4 \times 10^{15}$/cm$^2$.

Subsequently, the substrate is heated at 600° C. for 12 hours in a nitrogen atmosphere in order to activate the dopant, following which it is heat annealed in a hydrogen atmosphere at 400° C. for 1 hour in order to perform hydrogenation of the semiconductor film and reduce a defect level density.

Figure 3E:
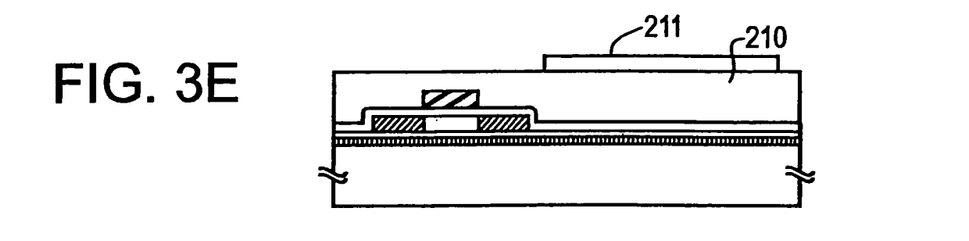

A silicon oxide film 210 is then formed on the entire surface as an interlayer insulator. The deposition is carried out in the treatment chamber 105 using a mixture of TEOS and oxygen as a starting gas. The CVD may be any one of plasma CVD, low pressure CVD or atmospheric pressure CVD. Alternatively, the silicon oxide film 210 may be formed in a different apparatus from the apparatus of FIG. 1. The thickness of the silicon oxide film is 0.3 μm to 1 μm, for example, 0.3 μm (3000 Å). The substrate temperature is in the range of 250-450° C., for example, 350° C. The silicon oxide film is mechanically polished to obtain a leveled surface. This step may be replaced by an isotropic dry etching in a chamber provided in an apparatus of FIG. 1. Further, an ITO film is formed by sputtering and patterned to form a pixel electrode 211 as shown in FIG. 3E.

Figure 3F:
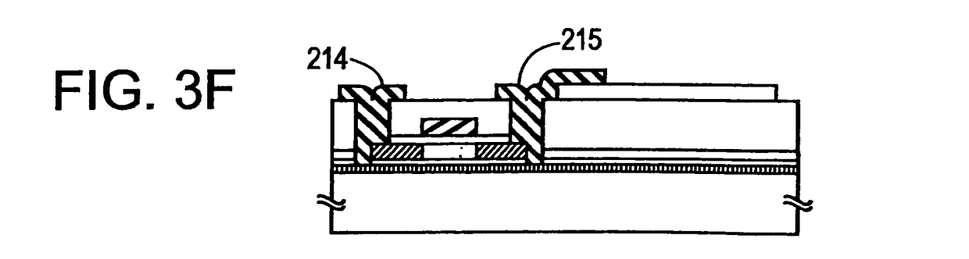

The interlayer insulator is etched as shown in FIG. 3F in order to form contact holes through which wirings 214 and 215 can reach the impurity regions (source and drain regions). The wiring 215 is connected to the pixel electrode 211. Also, the material of the wirings is chromium or titanium nitride, for example. As shown in FIG. 3E, the wirings contact both of the top surface and side surface of the impurity regions, i.e. top-side contact.

Finally, the entire structure is annealed in hydrogen at 300-400° C. for 1 to 2 hours. As a result, the silicon is hydrogenated. Although not shown in the drawings, a plurality of TFTs are formed on the same substrate in the form of a matrix at the same time. Also, a peripheral circuit constituted by TFTs may be formed on the same substrate. Thus, a circuit substrate for a monolithic type active matrix liquid crystal device is formed.

While the present invention is described with reference to the preferred embodiments, the present invention should not be limited to these particular examples but limited only to the appended claims. Many modifications may be made without departing the scope of the invention.

For example, various kinds of substrates may be processed in the apparatus of the present invention, for example, glass substrate, semiconductor substrate such as silicon substrate, or other insulating materials including a semiconductive or conductive substrates having an insulating surface thereon. For example, a glass substrate is suitable when forming an electro-optical device such as an active matrix liquid crystal device or an image sensor. Also, when using quartz as a substrate, the silicon nitride film 202 and silicon oxide film 203 may be omitted. Further, it is possible to raise the temperature of the thermal annealing after heat crystallization or heat oxidation to about 1000° C. when using a quartz substrate. Accordingly, it is possible to obtain a crystalline silicon film having an improved crystallinity.

Also, the TFT formed in the present invention may be a bottom gate type TFT.

What is claimed is:
1. A method of manufacturing a semiconductor device comprising:
    forming a base insulating film over a substrate in a multi-chamber apparatus having a plurality of film formation chambers;
    forming a semiconductor film comprising amorphous silicon over the base insulating film in the multi-chamber apparatus;
    taking the substrate out of the multi-chamber apparatus after the formation of the semiconductor film;
    crystallizing the semiconductor film outside the multi-chamber apparatus; and
    forming a gate insulating film over the semiconductor film,
    wherein each of the base insulating film and the semiconductor film is formed by CVD, and
    wherein the base insulating film and the semiconductor film are successively formed without taking the substrate out of the multi-chamber apparatus.

2. The method of manufacturing a semiconductor device according to claim 1, wherein the base insulating film is a silicon oxide film.

3. The method of manufacturing a semiconductor device according to claim 1, wherein the base insulating film includes fluorine.

4. The method of manufacturing a semiconductor device according to claim 1, wherein the gate insulating film is a silicon oxide film.

5. The method of manufacturing a semiconductor device according to claim 1, wherein each of the base insulating film and the semiconductor film is formed by plasma CVD.

6. The method of manufacturing a semiconductor device according to claim 1, wherein the gate insulating film is formed by CVD.

7. The method of manufacturing a semiconductor device according to claim 1, wherein the semiconductor device is an active matrix display device.

8. The method of manufacturing a semiconductor device according to claim 1, wherein the semiconductor film is formed in a different chamber from the base insulating film.

9. The method of manufacturing a semiconductor device according to claim 1, wherein the crystallizing step is performed by irradiating the semiconductor film with a laser beam.

10. The method of manufacturing a semiconductor device according to claim 1, further comprising:
    cleaning one of the plurality of film formation chambers by a cleaning gas.

11. The method of manufacturing a semiconductor device according to claim 10, wherein the cleaning gas comprises $NF_3$.

12. The method of manufacturing a semiconductor device according to claim 10, wherein the cleaning step and one of the base insulating film formation step and the semiconductor film formation step are performed at the same time.

13. A method of manufacturing a semiconductor device comprising:
    forming a base insulating film over a substrate in one of a plurality of film formation chambers of a multi-chamber apparatus, the multi-chamber apparatus having a substrate transfer chamber connected to one of the plurality of film formation chambers;
    forming a semiconductor film comprising amorphous silicon over the base insulating film in one of the plurality of film formation chambers of the multi-chamber apparatus;
    taking the substrate out of the multi-chamber apparatus via the substrate transfer chamber after the formation of the semiconductor film;
    crystallizing the semiconductor film outside the multi-chamber apparatus;
    forming a gate insulating film over the semiconductor film; and
    forming a gate electrode over the gate insulating film,
    wherein each of the base insulating film and the semiconductor film is formed by CVD, and
    wherein the base insulating film and the semiconductor film are successively formed without taking the substrate out of the multi-chamber apparatus.

14. The method of manufacturing a semiconductor device according to claim 13, wherein the base insulating film is a silicon oxide film.

15. The method of manufacturing a semiconductor device according to claim 13, wherein the base insulating film includes fluorine.

16. The method of manufacturing a semiconductor device according to claim 13, wherein the gate insulating film is a silicon oxide film.

17. The method of manufacturing a semiconductor device according to claim 13, wherein each of the base insulating film and the semiconductor film is formed by plasma CVD.

18. The method of manufacturing a semiconductor device according to claim 13, wherein the gate insulating film is formed by CVD.

19. The method of manufacturing a semiconductor device according to claim 13, wherein the semiconductor device is an active matrix display device.

20. The method of manufacturing a semiconductor device according to claim 13, wherein the semiconductor film is formed in a different chamber from the base insulating film.

21. The method of manufacturing a semiconductor device according to claim 13, wherein the crystallizing step is performed by irradiating the semiconductor film with a laser beam.

22. The method of manufacturing a semiconductor device according to claim 13, further comprising:
    cleaning one of the plurality of film formation chambers by a cleaning gas.

23. The method of manufacturing a semiconductor device according to claim 22, wherein the cleaning gas comprises $NF_3$.

24. The method of manufacturing a semiconductor device according to claim 22, wherein the cleaning step and one of the base insulating film formation step and the semiconductor film formation step are performed at the same time.

25. A method of manufacturing a semiconductor device comprising:
    forming a base insulating film over a substrate in one of a plurality of film formation chambers of a multi-chamber apparatus, the multi-chamber apparatus having a substrate transfer chamber connected to one of the plurality of film formation chambers;
    forming a semiconductor film comprising amorphous silicon over the base insulating film in one of the plurality of film formation chambers of the multi-chamber apparatus;
    taking the substrate out of the multi-chamber apparatus via the substrate transfer chamber after the formation of the semiconductor film;
    crystallizing the semiconductor film outside the multi-chamber apparatus;
    patterning the semiconductor film outside the multi-chamber apparatus;
    forming a gate insulating film over the semiconductor film; and
    forming a gate electrode over the gate insulating film,
    wherein each of the base insulating film and the semiconductor film is formed by CVD, and
    wherein the base insulating film and the semiconductor film are successively formed without taking the substrate out of the multi-chamber apparatus.

26. The method of manufacturing a semiconductor device according to claim 25, wherein the base insulating film is a silicon oxide film.

27. The method of manufacturing a semiconductor device according to claim 25, wherein the base insulating film includes fluorine.

28. The method of manufacturing a semiconductor device according to claim 25, wherein the gate insulating film is a silicon oxide film.

29. The method of manufacturing a semiconductor device according to claim 25, wherein each of the base insulating film and the semiconductor film is formed by plasma CVD.

30. The method of manufacturing a semiconductor device according to claim 25, wherein the gate insulating film is formed by CVD.

31. The method of manufacturing a semiconductor device according to claim 25, wherein the semiconductor device is an active matrix display device.

32. The method of manufacturing a semiconductor device according to claim 25, wherein the semiconductor film is formed in a different chamber from the base insulating film.

33. The method of manufacturing a semiconductor device according to claim 25, wherein the crystallizing step is performed by irradiating the semiconductor film with a laser beam.

34. The method of manufacturing a semiconductor device according to claim 25, further comprising:
cleaning one of the plurality of film formation chambers by a cleaning gas.

35. The method of manufacturing a semiconductor device according to claim 34, wherein the cleaning gas comprises $NF_3$.

36. The method of manufacturing a semiconductor device according to claim 34, wherein the cleaning step and one of the base insulating film formation step and the semiconductor film formation step are performed at the same time.

* * * * *